United States Patent [19]

Wiemer et al.

[11] Patent Number: 5,058,491
[45] Date of Patent: Oct. 22, 1991

[54] BUILDING AND METHOD FOR MANUFACTURE OF INTEGRATED CIRCUITS

[75] Inventors: Klaus C. Wiemer, Shih-Lin; James E. Bühler, Taipei, both of Taiwan; Rudolf O. Simon, Korntal; Helmut A. Laub, Stuttgart, both of Fed. Rep. of Germany

[73] Assignee: Taiwan Semiconductor Manufacturing Company, Ltd., Taiwan

[21] Appl. No.: 572,880

[22] Filed: Aug. 27, 1990

[51] Int. Cl.$^5$ .............................. B01L 1/04; F24F 7/07
[52] U.S. Cl. ..................... 98/115.3; 98/34.5; 98/31.5
[58] Field of Search ............ 98/33.1, 115.3, 31.5, 98/31.6, 34.5, 34.6, 36; 55/385.2

[56] References Cited

U.S. PATENT DOCUMENTS

| | | | |
|---|---|---|---|
| 2,912,918 | 11/1959 | Mead | 55/385.2 |
| 4,489,881 | 12/1984 | Dean et al. | 236/49 |
| 4,534,389 | 8/1985 | Tullis | 141/98 |
| 4,549,472 | 10/1985 | Endo et al. | 98/34.6 |
| 4,608,066 | 8/1986 | Cadwell, Jr. | 98/31.5 X |
| 4,674,936 | 6/1987 | Bonora | 414/217 |
| 4,676,144 | 6/1987 | Smith, III | 98/115.3 X |
| 4,693,173 | 9/1987 | Saiki et al. | 98/31.5 |
| 4,699,640 | 10/1987 | Suzuki et al. | 98/31.5 X |
| 4,724,874 | 2/1988 | Parikh et al. | 141/98 |
| 4,781,511 | 11/1988 | Harada et al. | 414/217 |
| 4,826,360 | 5/1989 | Iwasawa et al. | 406/51 |
| 4,838,150 | 6/1989 | Suzuki et al. | 98/31.5 |

FOREIGN PATENT DOCUMENTS 0194140 8/1987 Japan ......................... 98/36

OTHER PUBLICATIONS

"VTC Submicron CMOS Factory" Wilton Workman and Lloyd Kavan 10-87 *Microcontamination.*
"Defect Density Reduction in a Class 100 Fab Utilizing the Standard Mechanical Interface" Stephen Titus et al, 11-87 *Solid State Technology.*

*Primary Examiner*—Albert J. Makay
*Assistant Examiner*—William C. Doerrler
*Attorney, Agent, or Firm*—George O. Saile

[57] ABSTRACT

A building for the manufacture of integrated circuits which includes a manufacturing equipment floor with processing equipment for the manufacture of integrated circuits, a floor under the manufacturing floor has supporting equipment associated with each of the processing equipment, and an upper floor above the manufacturing floow supports a plenum system that provides at least two classes of clean air circulation to the manufacturing floor. Each piece of processing equipment is enclosed with means to separate it from the surrounding air. A clean air input of the highest class of clean air purity is provided to the processing equipment in the enclosure. The air/gas exhaust is directed through an air/gas handling system. Means are also provided to provide the surrounding areas a clean air input of a lower class of clean air purity from the plenum system and the air/gas exhaust directed to an air/gas handling system. Interchangeable means are provided that are associated with the plenum system which quickly allow the change of air purity to another class of clean air purity whereby the processing equipment can be removed, replaced with another processing equipment or a new piece of processing equipment inserted without undue down time of the manufacturing of the integrated circuits.

20 Claims, 3 Drawing Sheets

BUILDING AND METHOD FOR MANUFACTURE OF INTEGRATED CIRCUITS

BACKGROUND OF THE INVENTION (1) Field of the Invention

The present invention relates to a building for manufacturing highly dense, most advanced integrated circuits that is designed to use localized clean rooms around each piece of processing equipment and methods for manufacturing integrated circuits.

(2) Description of the Prior Art

There continues to be a dramatic increase in the complexity of integrated circuits each year. As applications develop for memories, microprocessor and minicomputers there is an increasing demand for greater complexities, higher switching speeds, and smaller devices in the integrated circuits.

The manufacturing or fabrication building design for integrated circuits has not kept up with the progress of the technologies for the manufacture of integrated circuits. The shortcoming in design has involved the clean room in which the processing equipment for making the integrated circuits is located. The clean room is of utmost importance because airborne contamination particles cause defects in the integrated circuits to the point that there is zero yield from the manufacture.

The present designs for manufacturing or fabrication buildings for integrated circuits involve maintaining a clean room by air circulation and filtering equipment for the whole manufacturing area at the highest possible clean room class. The U.S. Federal Standard No. 209d maintains the definition of the Classes from Class 100,000 down to Class 1. The most desired clean room today is Class 10 or even Class 1 if that could be attainable. However, the ability to design buildings with clean rooms of such classes is difficult due to the requirement of human workers, a major source of particulate contamination in the clean room and the substantial construction cost of accomplishing such a design.

One approach to upgrade existing clean rooms to higher air cleanliness has been described in the paper "Defect Density Reduction in a Class 100 Fab Utilizing the Standard Mechanical Interface" by Stephen Titus et al published in November 1987 issue of Solid State Technology. The photoresist coater and mask aligner on the manufacturing floor were fitted with an environmental enclosures with laminar air flow which provides near Class 1 ambient directly above the wafer processing area, and a robotic interface. A sealed wafer carrier which isolates the cassette of wafers from the environment was used to move the wafers throughout the clean room except when the robotic interface removes the wafer cassette into the coater or mask aligner. The experiment was stated as successful in the publication. The use of these structures in a wafer-fabrication building is described in the paper "VTC's Submicron CMOS Factory" by Wilton Workman et al in Microcontamination, October 1987. However, there is no description of methods for mobility or the adding/removal of processing equipment in an easy or quick manner in either of these papers. There are patents describing the details of this system involving the wafer cassette pod and robotic interfaces which include U.S. Pat. No. 4,534,389; U.S. Pat. No. 4,674,936; U.S. Pat. No. 4,724,874; U.S. Pat. No. 4,781,511; and U.S. Pat. No. 4,826,360.

SUMMARY OF THE INVENTION

It is an object of this invention to provide a building for the manufacture of integrated circuits which allows for the highest possible clean room Class at the processing equipment, while making the mobility or addition/removal of processing equipment easy and quick, and that has substantial cost advantages.

It is a further object of this invention to describe a method for manufacturing integrated circuits with only the processing equipment maintained at the highest class of clean air while the surrounding areas are at lower class of clean air and with availability of quickly moving or adding/removal of the processing equipment with minimal interuption of the production line.

In accordance with the present invention, a building for the manufacture of integrated circuits is described. It includes a manufacturing equipment floor with processing equipment for the manufacture of integrated circuits supported thereon. A lower floor under the manufacturing floor has supporting equipment associated with each of the processing equipment. An upper floor above the manufacturing floor supports a plenum system that provides at least two classes of clean air circulation to the manufacturing floor. Each piece of processing equipment is enclosed with means to separate it from the surrounding air. A clean air input of the highest class of clean air purity is provided to the processing equipment in the enclosure. The air/gas exhaust is directed through an air/gas handling system. Means are also provided to provide the surrounding areas a clean air input of a lower class of clean air purity from the plenum system and the air/gas exhaust directed to an air/gas handling system. Interchangeable means are provided that are associated with the plenum system which quickly allow the change of air purity to another class of clean air purity whereby the processing equipment can be removed, replaced with another processing equipment or a new piece of processing equipment inserted without undue down time of the manufacturing of the integrated circuits. An example of the interchangeable means include filter and blank plates. The blank plates prevent flow of air from the plenum and the filter plates provide air flow means and filtration of the air to the highest class of clean air purity.

Further, in accordance with the present invention there is shown a method for the manufacturing of integrated circuits. The method allows the fabrication of the integrated circuits while only the processing equipment is maintained at the highest class of clean air while the surrounding areas are at a lower class of clean air and with availability of quickly moving or adding/removal of processing equipment without disturbing the production line environmental quality. A manufacturing floor is provided that has the processing equipment enclosed from the surrounding areas. A lower floor is provided with supporting equipment associated with each of the processing equipment. An upper floor is provided above the manufacturing floor for supporting a plenum system that has a least two classes of clean air for circulation to the manufacturing floor. The enclosures of the processing equipment are provided with the highest class of clean air from the plenum/filter system. The air/gas from the processing equipment is exhausted to an air/gas handling system. The surrounding areas are in a similar fashion provided with a lower class of clean air and its air/gas is exhausted to the air/gas handling system. There is provide interchangeable means associated with the plenum system which quickly allow the change of location of the input of clean air from one class of clean air to another class of clean air. Wafers are transported from one piece of processing equipment to another in the same clean air class as exists in the processing equipment. The sequence of the process of manufacture is followed in the processing equipment from one to another until the integrated circuits are completed in the wafers.

DESCRIPTION OF THE PREFERRED EMBODIMENTS

Figure 1:
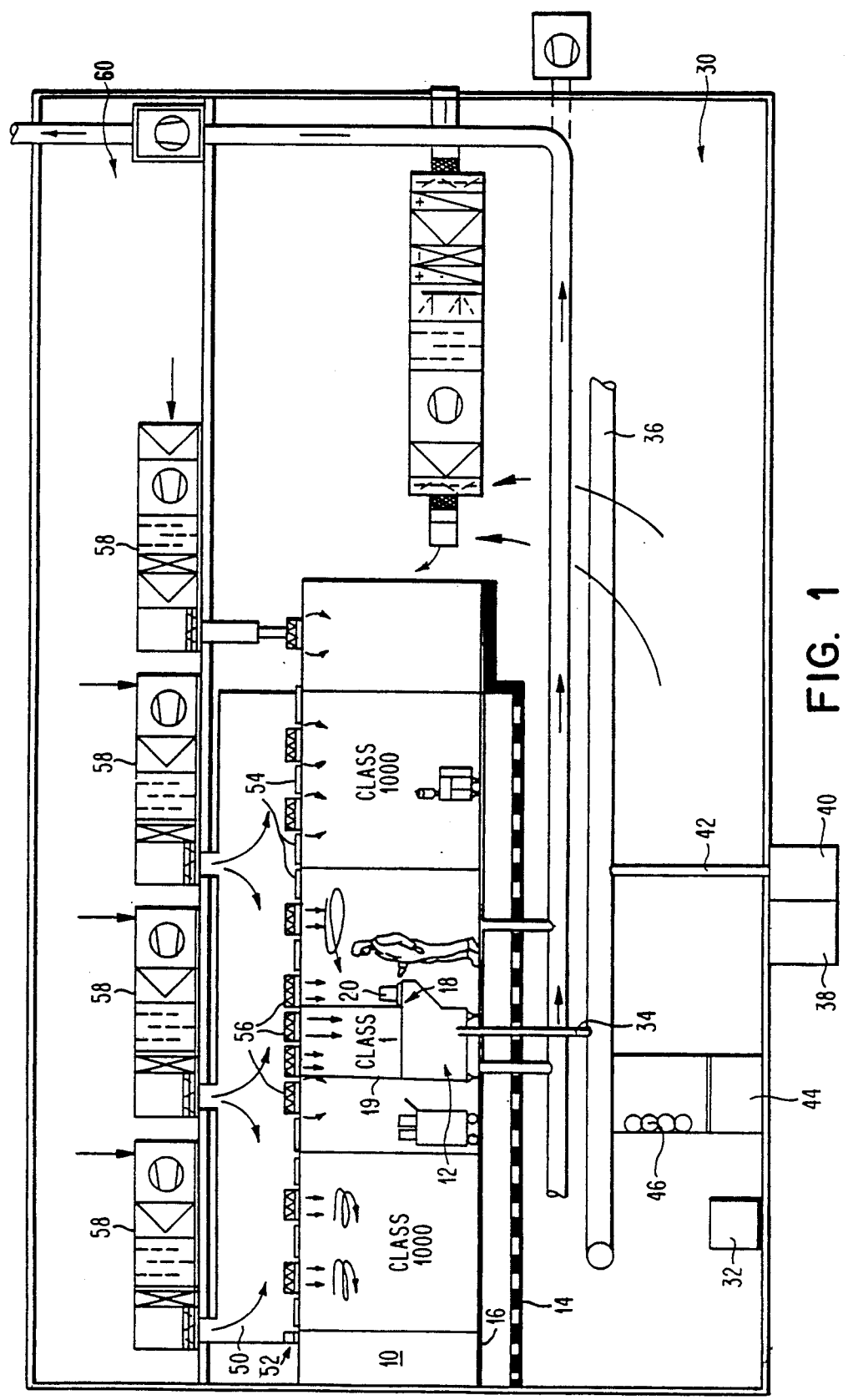
FIG. 1 is a schematic cross-sectional view of the building of the present invention.

Referring now more particularly to FIG. 1, there is shown a building for the manufacture or fabrication of the most advanced integrated circuits. This building includes a manufacturing equipment floor 10 with processing equipment 12 for the manufacture of integrated circuits supported upon the floor. The floor construction is preferably a waffle slab 14 which is made of reinforced concrete having openings of typically 40 cm. by 40 cm. in size.

A raised floor 16 is located above the waffle slab 14. This floor is composed of a floor stand (pedestal) system. Floor panels, typically 60 cm. by 60 cm. are placed on top of the pedestals. The floor tiles and pedestals are designed to meet the loading and seismic requirements and the tiles are covered with an electrically, non-conductive material. The alternate is a stee system totally grounded. The processing equipment 12 which perform the various fabrication operations upon the semiconductor wafers to ultimately form a complete integrated circuit are positioned upon the raised floor.

Figure 2:
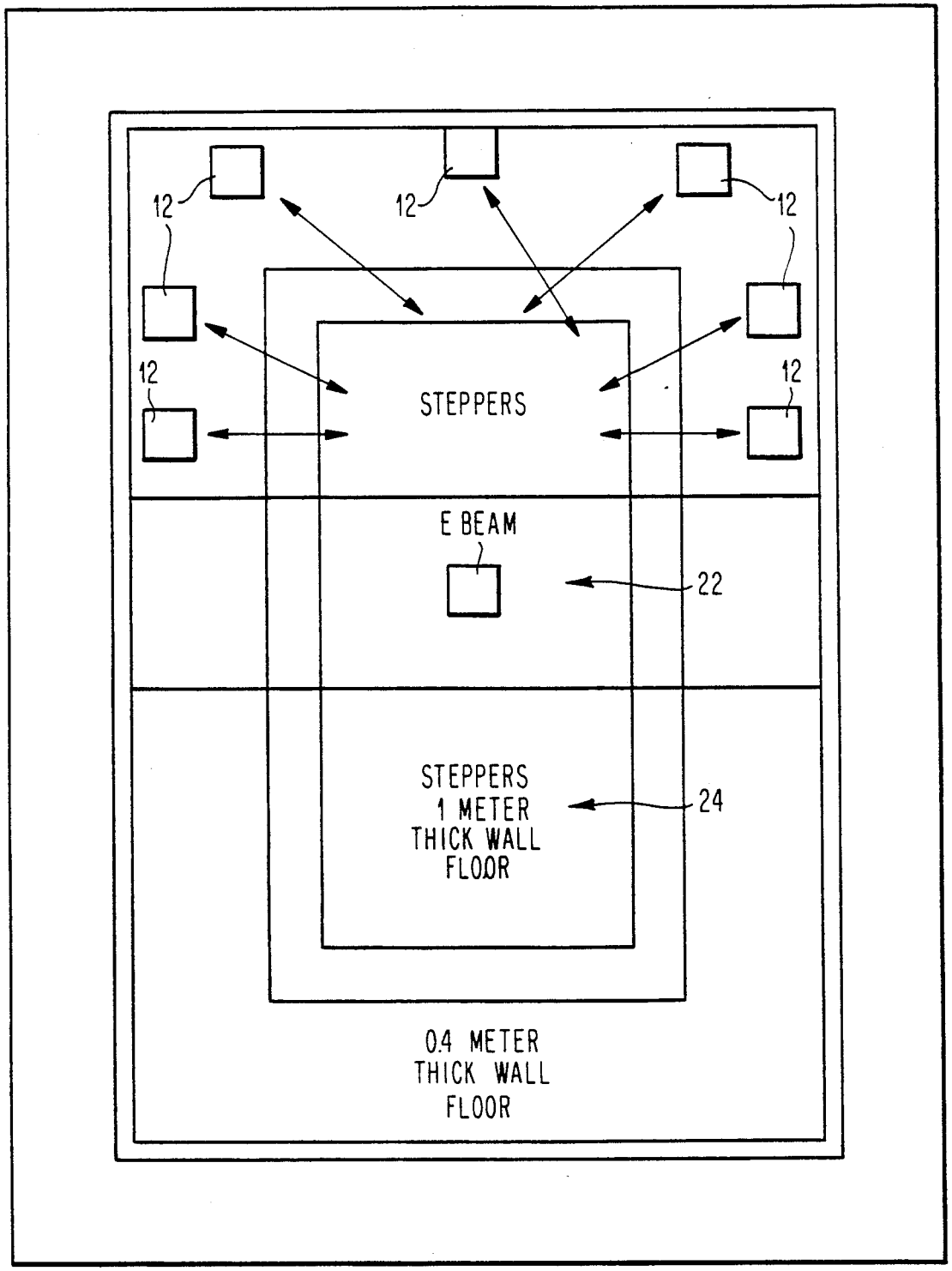
FIG. 2 is a schematic layout of the processing equipment on the manufacturing floor.

FIG. 2 schematically shows the horizontal layout of the manufacturing floor. The central region of the manufacturing floor is specially constructed to form a suitable place for the vibration sensitive lithography and measurement systems 22. The arrows indicate schematically the movement of the wafers between processing equipment 12 and the lithography and measurement system area 22. The thicker waffle slab and the specially designed isolation system from the peripheral region 24 for supporting the other processing equipment 12 is specifically designed to meet the vibration specifications required for manufacturing. Joints of the floors and walls of this area are segregated to avoid transmittal of vibration from the central building. The design criteria for this isolated area is equal to or less than 1.6 RMS. micron/sec., 5 to 10 Hz. and 0.025 RMS. micron/sec., 10 to 50 Hz. of amplitude measured at 0.125 Hz. resolution.

A lower floor 30 is located below the manufacturing floor. This floor has the purpose of supporting equipment that need not be in the clean room class of the manufacturing floor 10, but is nonetheless needed for the manufacture of the integrated circuits. For example, the normal supporting equipment 32 that are associated with each piece of processing equipment 12. This type of equipment 32 would include motors, blowers, power supplies, heat exchangers, chemical transfer cabinets, etc.

Figure 3:
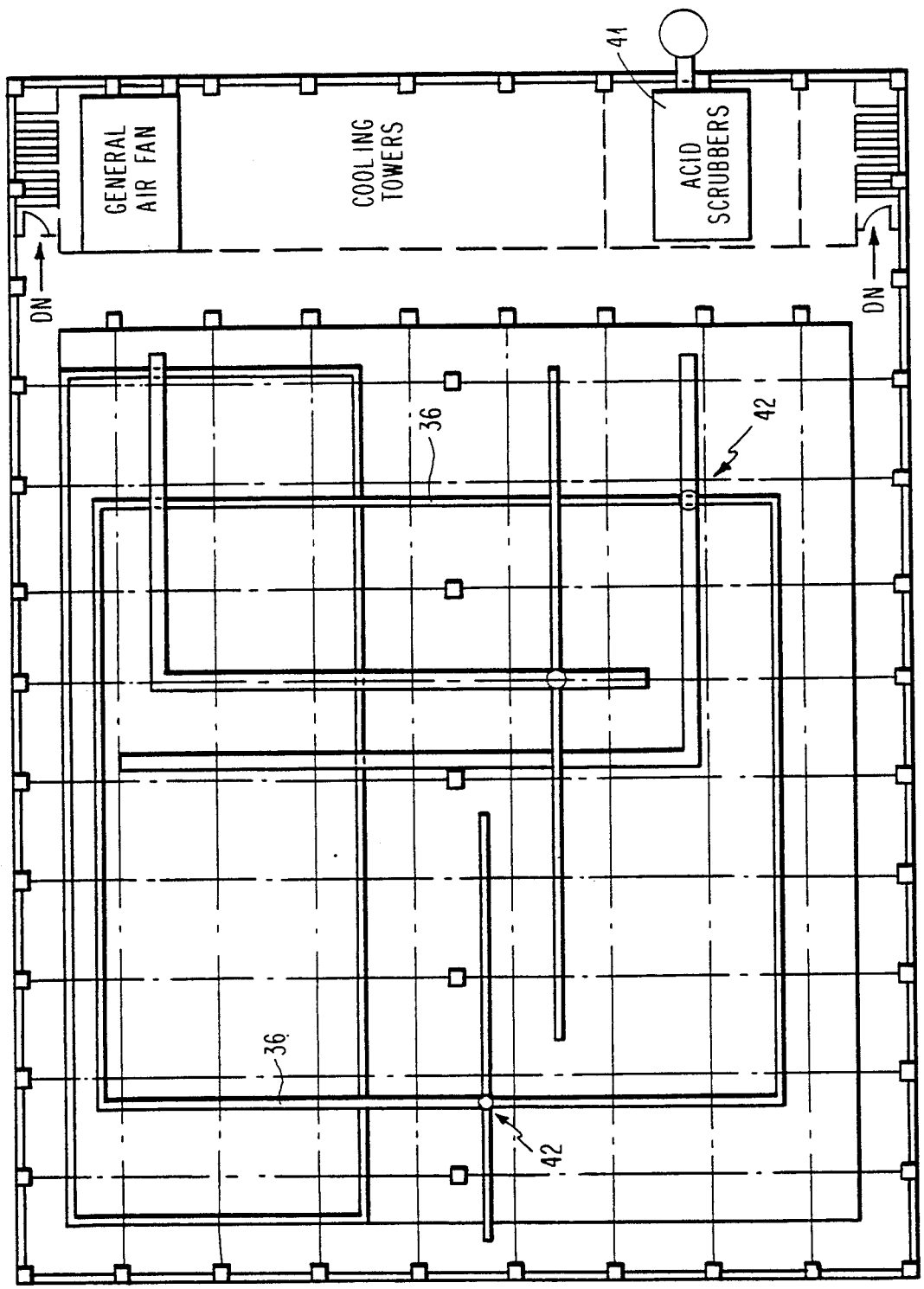
FIG. 3 is a schematic layout of the multiple ringed branch headers in the air/gas handling system.

The air/gas handling system is also located at the lower floor level. This system handles the air/gas that is exhausted from the pieces of processing equipment 12 on the manufacturing floor. This system includes exhaust piping 34 and multiple ringed branched headers 36. A typical layout of this multiple ringed branched headers 36 is seen in FIG. 3. This air/gas handling system design is an important feature which allows the quick and easy removal, replacement or addition of processing equipment 12. The design is such that the piping 34 can easily be inserted or removed from the multiple ringed branched headers 36 that are conveniently located under the whole manufacturing floor. The ring design with relief dampers provides easy balance during initial startup and during modification.

There are trenches in the lower floor 30. There are at least two trenches 38 and 40 which are designated to handle separately the toxic gases and the general air in the air/gas flow within the building. Other trenches could be used to handle certain toxic gases from certain processing equipment through a particular ringed header system. Vertical headers 42 allow the flow of the toxic gases from the ringed headers 36 to the toxic gas trench 40. The toxic gases from trench 40 are moved into appropriate scrubbers 41 and other air purifying equipment (not shown) for cleaning and the resulting highly purified air is exhausted. The general air from trench 38 is moved via fan units directly to the atmosphere.

There is also located at various points of the lower floor raised walkways 44 at suitable heights, such as 2 meters above the floor that allows workers to easily reach piping or electrical conduits 46, the multiple ringed branch headers 36, exhaust pipes 34, vertical headers 42 and the like. These walkways also allow for the easy movement for workers and equipment below the walkways 44.

The design of the lower floor 30 also allows for additional space management. This may include the use of non-contaminating work areas including maintenance, indirect storage, laundry and the like.

The upper floor 60 above the manufacturing floor 10 is for supporting the air handling systems that include the air handling units (AHU) 58 and the plenum system 50.

The operation of the localized Class 1 or below clean room system may be more fully understood with reference to FIG. 1. FIG. 1 shows the details of the processing equipment 12, SMIF (Standard Mechanical Interface) handler 18, enclosure 19, and plenum system 50 with its ceiling or bottom portion 52 with blank plates 54 and filter plates 56. The processing equipment 12 that is open to the wafers wherein the integrated circuits are being fabricated are only exposed to Class 1 air that is moving through the enclosure 19 in a laminar flow condition. The flow is typically 0.45 meters/sec. The enclosure 19 is a simple box-like structure made of rigid plastic panels with metal supports that has the function of isolating the clean air of Class 1 or below from the surrounding areas of a higher class of clean air such as Class 1000. The air flow in the Class 1000 areas are typically 0.1 meters/sec.

The SMIF (Standard Mechanical Interface) handler 18 may be of various designs which allow the movement of a container 20 having a cassette of wafers into the pieces of processing equipment 12. One design is shown, for example in U.S. Pat. No. 4,474,939 wherein the container is moved by a human into the receiving port of the handler from where the container and wafer cassette is moved into the clean Class 1 air of the processing equipment. The container 20 is also maintained at Class 1 purity by its construction even while it moves through the surrounding areas. The movement of these containers can also be automated as described for example in U.S. Pat. No. 4,826,360. The containers 20 themselves can be of various designs.

The clean air of Class 1000 or Class 1 is provided to the manufacturing floor 10 environment by ceiling or bottom portion of the plenum 50 construction in conjunction with the air handling system 58. The interchangeable means associated with the plenum system 50 which quickly allow the change of location of the input of clean air from one class of clean air purity to another class of clean air purity is preferred to be blank plates 54 and filter plates 56. The blank plates 56 have the function of preventing air from the plenum system 50 from reaching the environment of the manufacturing floor 10 from the area that it covers. The filter 56 includes a filter structure that removes particulate contamination. The preferred filter structure is a metal or wooden treated frame with a totally sealed paper pleated packing. The specification must meet or exceed US 209d Federal Standards. Such a filter is manufactured by Solfiltra Company in France.

The air handling unit 58 also may contain filtering capacity as well as air movement capabilities. This unit 58 dependant upon manufacturing requirements, a typical unit would consist of a fan, cooling coils and a 85% post filter. The filter is periodically changed.

The air passing through the processing equipment 12 picks up some toxic gases in some of the pieces of equipment. The exhaust of the air/gas moves into the air/gas handling system that includes the exhaust pipes 34 and the Multiple ringed branch headers 36. The treatment of this exhaust toxic gas was considered above.

It should now be understood that the design of this manufacturing building for the most advanced integrated circuit production has been planned to allow the highly flexible movement of the processing equipment whether in its replacement, total removal or total addition to the building. The down time during change of equipment is kept to a bare minimum. The supply piping for the equipment is zone valved. The only shut down of that zone is to turn-on and rebalance (if required) piped services in the zone, such as gas and water. The rest of the Fabrication floor and equipment can be operating normally during the movement of processing equipment.

The method of manufacturing integrated circuits with only the processing equipment maintained at the highest class of clean air while the surrounding area are at a lower class of clean air and with the availability of quickly moving or adding/removal of the processing equipment can be understood with reference to all of the FIGS. 1 through 3. A manufacturing floor 10 is provided that has the processing equipment 12 enclosed from the surrounding areas. A lower floor 30 is provided with supporting equipment 32 associated with each of the processing equipment 12. An upper floor 60 is provided above the manufacturing floor 10 for supporting a plenum system 50 that has at least two classes of clean air for circulation to the manufacturing floor.

The enclosures 19 of the processing equipment 12 are provided with the highest class of clean air from the plenum system 50. The air/gas from the processing equipment 12 is exhausted to an air/gas handling system which may include the exhaust pipes 34 and multiple ringed branch headers 36. The surrounding areas are in a similar fashion provided with a lower class of clean air and its air/gas is exhausted to the air/gas handling system. There is provide interchangeable means associated with the plenum system 50 which quickly allow the change of location of the input of clean air from one class of clean air to another class of clean air.

Wafers are transported from one piece of processing equipment 12 to another in the same clean air class as exists in the processing equipment by containers 20 having special construction that assures the maintenance of its clean air standards. The sequence of the process of manufacture is followed in the processing equipment from one to another until the integrated circuits are completed in the wafers.

The interchangeable means including filter plates and blank plates. The method of replacing a piece of processing equipment involves stopping the sequence of processing in that piece of equipment, turning off the clean air to the enclosed piece of equipment, removing the piece of equipment from the manufacturing floor, installing another piece of processing equipment into the same location, turning on the clean air, and restarting the new piece of processing equipment to its sequence of process.

Where it is desired to completely remove a piece of processing equipment 12 the following is the method of doing so. The sequence of the processing steps in the one piece of equipment is stopped without stopping any other of the sequence of process in other pieces of equipment. The clean air is turned off to the equipment involved in the removal. The piece of equipment is removed from the manufacturing floor. The filter plates that provide the highest class of clean air are now replaced with blank plates to prevent air from the plenum from reaching the manufacturing environment. The exhaust pipe 34 can quickly be removed from the multiple ringed branch header 36.

In a similar fashion new pieces of equipment may be added to the manufacturing floor by replacing the blank plates 54 with filter plates 56, followed by positioning the processing equipment in a suitable enclosure and the appropriate connection of an exhaust pipe 34 to the available multiple ringed branch header.

While the invention has been particularly shown and described with reference to the preferred embodiments thereof, it will be understood by those skilled in the art that various changes in form and details may be made without departing from the spirit and scope of the inventions. For example, the particular type of standard manufacturing interface can readily be changed to handle the desired container or other means for moving wafers into and out of the ultraclean conditions in the processing equipment.

What is claimed is:

1. A building for the manufacture of integrated circuits comprising:
   a manufacturing equipment floor with processing equipment for the manufacture of said integrated circuits supported thereon;
   a lower floor under said manufacturing equipment floor with supporting equipment associated with each of said processing equipment;
   a ceilling over the top of said manufacturing equipment floor for supporting a plenum system that provides at least two classes of clean air circulation to said manufacturing floor;

means for enclosing from surrounding areas each piece of said processing equipment and for providing said enclosure with a clean air input of said highest class of clean air purity from said plenum system and an air/gas exhaust to an air/gas handling system;

means for providing the said surrounding areas a clean air input of a lower class of clean air purity from said plenum system and an air/gas exhaust to said air/gas handling system;

means in said air/gas handling system for separately handling said air/gas exhaust from within said processing equipment; and interchangeable means associated with said plenum system which quickly allow the change of location of the input of clean air from one class of clean air purity to another class of clean air purity whereby said processing equipment can be removed, replaced with another processing equipment or a new piece of processing equipment inserted without undue down time of the manufacturing of said integrated circuits.

2. The building of claim 1 wherein said manufacturing equipment floor includes a waffle slab floor with a pedestal floor supported thereby and processing equipment supported by said pedestal floor, and wherein said pedestal floor covers all of those areas of the equipment floor upon which said processing equipment could be positioned.

3. The building of claim 1 wherein the said means in said air/gas handling system for separately handling said air/gas exhaust includes multiple ringed branch headers which allow connection to exhaust from said processing equipment positioned at any desired position on said manufacturing floor and connected to said exhaust.

4. The building of claim 3 and further comprising separate trenches in the lower floor for at least toxic gases and air that has moved through said air/gas handling system; and vertical headers connecting said multiple ringed branch headers to the appropriate said trenches.

5. The building of claim 1 wherein the said supporting equipment associated with each of said processing equipment is so constructed that the connections to said processing equipment can quickly be made and said supporting equipment moved whereby said processing equipment can be changed without undue down time of the manufacturing of said integrated circuits.

6. The building of claim 1 wherein the said interchangeable means include filter and blank plates which are interchangeable; said filter plates includes high performance filter which can produce clean air of the highest class of clean air purity and said blank plates prevent air from entering said manufacturing floor.

7. The building of claim 6 wherein said high performance filter plate including a ULPA 99.99995% efficiency filter packing.

8. The building of claim 4 and further comprising means for returning the said air from said separate air trench to said plenum system; scrubber means for said toxic gases and means for connecting the said toxic gases separate trench to said scrubber means.

9. The building of claim 1 wherein said manufacturing equipment floor is constructed of a waffle slab; said waffle slab in the central region of said floor is substantially thicker than the said waffle slab in the peripheral region of said floor; the said processing equipment involved with lithography are located on that said central region and the other processing equipment are located in said peripheral regions.

10. The building of claim 9 wherein the said waffle slab floor supports a raised floor upon which said processing equipment rests.

11. The building of claim 1 and further comprising a raised walkway above said lower floor at appropriate locations for easily reaching said air/gas handling system, other piping and electrical systems.

12. The method of manufacturing integrated circuits with only the processing equipment maintained at the highest class of clean air while the surrounding areas are at a lower class of clean air and with availability of quickly moving or adding/removal of processing equipment comprising:

providing a manufacturing equipment floor having processing equipment for the manufacture of said integrated circuits supported thereon;

providing a lower floor under said manufacturing equipment floor with supporting equipment associated with each of said processing equipment;

providing a ceiling over the top of said manufacturing equipment floor for supporting a plenum system that has at least two classes of clean air for circulation to said manufacturing floor;

enclosing from surrounding areas each piece of said processing equipment;

providing said enclosure with a clean air input of said highest class of clean air purity from said plenum system and exhausting air/gas from said processing equipment to an air/gas handling system;

providing to the said surrounding areas a clean air input of a lower class of clean air purity from said plenum system and exhausting the air/gas from said processing equipment to said air/gas handling system;

moving the exhausting air/gas from said processing equipment through appropriate portions of the said air/gas handling system and vertical headers connecting the said air/gas handling system to scrubbers for the said toxic gases and returning said air to said plenum system;

providing interchangeable means associated with said plenum system which quickly allow the change of location of the input of clean air from one class of clean air purity to another class of clean air purity whereby said processing equipment can be removed, replaced with another processing equipment or a new piece of processing equipment inserted without undue down time of the manufacturing of said integrated circuits;

transporting wafers from one piece of processing equipment to another in the same clean air class as exists in the processing equipment; and following through the sequence of the process of manufacture in said process equipment until said integrated circuits have been completed on said wafers.

13. The method of claim 12 wherein said transporting of wafers from on piece of said processing equipment to another is done by moving said wafers in a cassette that is enclosed in a container that has a clean air class identical to that within said processing equipment and each said processing equipment has a interface that accepts said cassette of wafers for processing.

14. The method of claim 13 wherein said highest class of clean air purity is class 1 or below within the enclosed said processing equipment and said container, and said lower class of clean air purity is class 1000 or below.

15. The method of claim 12 wherein the said interchangeable means include filter and blank plates which are interchangeable; said filter plates including high performance filter which can produce clean air of the highest class of clean air purity and said blank plates preventing air from entering said manufacturing floor.

16. The method of claim 15 and further comprising: stopping said sequence of processing steps in one piece of said processing equipment without stopping any other said sequence of process in other processing equipment, turning off the said clean air to the enclosed said piece of processing equipment, removing said piece of processing equipment from the said manufacturing floor, installing another piece of processing equipment into the same location, turning on said clean air, and restarting said another piece of processing equipment to its said sequence of process.

17. The method of claim 15 and further comprising: stopping said sequence of processing steps in one piece of said processing equipment without stopping any other said sequence of process in other processing equipment, turning off the said clean air to the enclosed said piece of processing equipment, removing said piece of processing equipment from the said manufacturing floor, replacing the said filter plates that provide said highest class of clean air with said blank plates to prevent air from entering said manufacturing floor.

18. The method of claim 15 and further comprising: replacing the said blank plates that prevent air from entering said manufacturing floor with said filter plates that provide said highest class of clean air at a location on the said manufacturing floor where a new piece of said processing equipment is desired, installing said new piece of processing equipment, enclosing said new piece of processing equipment from the surrounding areas, turning on said clean air, and starting said new piece of processing equipment to its said sequence of process.

19. The method of claim 12 wherein the exhausting air/gas from said processing equipment is moved through separate trenches in the said lower floor for at least toxic gases and air before moving the toxic gases to said scrubbers.

20. The method of claim 12 wherein said processing equipment used for lithographic processing are located on the central region of said manufacturing floor, the remaining said processing equipment are positioned around the peripheral region of said manufacturing floor and said transporting wafers is done to and from said lithographic processing equipment in the said central region from the peripheral region whereby the distance and time for said transporting is substantially reduced.

* * * * *